United States Patent
Averbuch et al.

[11] Patent Number: 4,492,857
[45] Date of Patent: Jan. 8, 1985

[54] PYROELECTRIC DETECTOR AND VIDICON

[75] Inventors: Marie-Thérèse Averbuch, Meylan; André Durif-Varambon, Varges; Sylviane Gauthier, Grenoble; Ion F. Nicolau, Saint Nazaire les Eymes; Jean C. Peuzin, Eybens, all of France

[73] Assignee: Commissariat a l'Energie Atomique, Paris, France

[21] Appl. No.: 415,702

[22] Filed: Sep. 7, 1982

[30] Foreign Application Priority Data

Sep. 9, 1981 [FR] France ............... 81 17075

[51] Int. Cl.³ .............................. H01J 40/14
[52] U.S. Cl. ................... 250/211 R; 423/306
[58] Field of Search ........... 250/211 R; 252/62.9 R; 423/299, 306, 508

[56] References Cited
U.S. PATENT DOCUMENTS 4,246,510 1/1981 Clark et al. .................. 313/388

FOREIGN PATENT DOCUMENTS 0141643 4/1979 Japan ............... 250/211 R
0186130 5/1981 Japan ............... 250/211 R

OTHER PUBLICATIONS

Applied Physics Letters, vol. 39, No. 2, Jul. 1981.

Primary Examiner—David C. Nelms
Assistant Examiner—James Gatto
Attorney, Agent, or Firm—Pearne, Gordon, Sessions, McCoy, Granger & Tilberry

[57] ABSTRACT

The invention relates to an ammonium phosphotellurate pyroelectric vidicon and detector.

The pyroelectric detector comprises a dielectric material inserted between two parallel electrodes, said material being a monodomain ferroelectric monocrystal having a polaraaxis, wherein the said material is ammonium phosphotellurate of chemical formula:

$Te(OH)_6$, $2[NH_4H_2PO_4]$, $[(NH_4)_2HPO_4]$.

8 Claims, 4 Drawing Figures

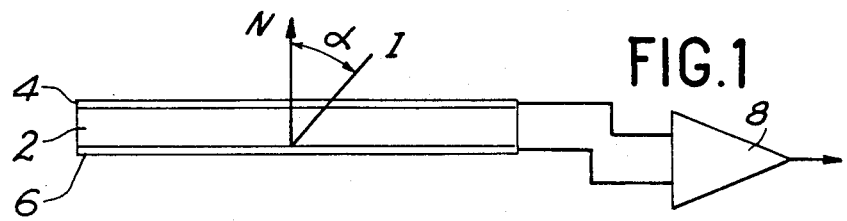
FIG. 1
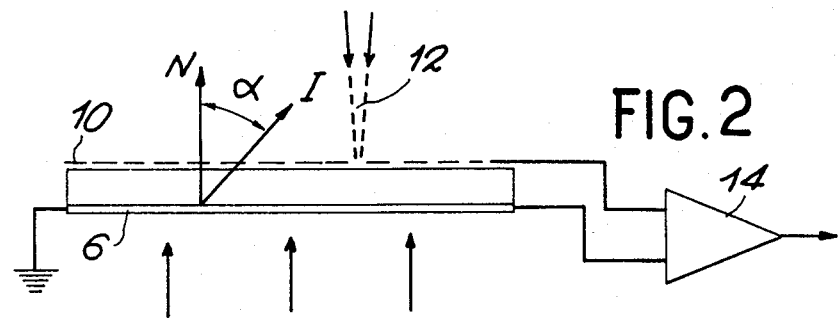
FIG. 2
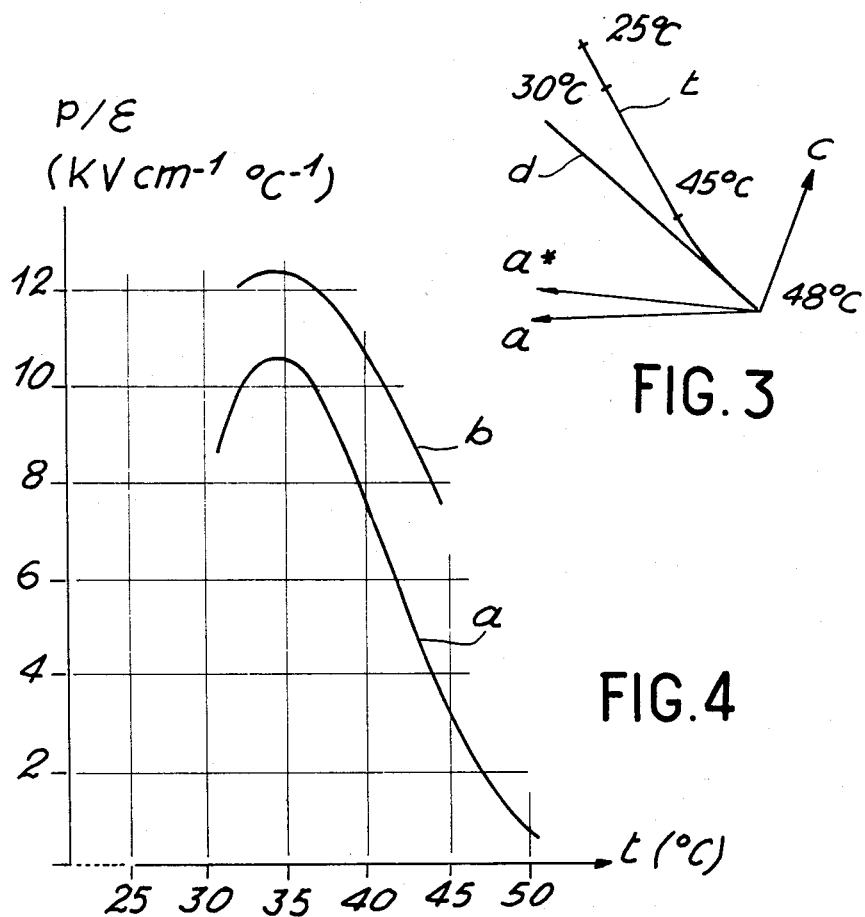
FIG. 3
FIG. 4

PYROELECTRIC DETECTOR AND VIDICON

BACKGROUND OF THE INVENTION

The invention relates to an ammonium phosphotellurate pyroelectric vidicon and detector. It applies more particularly therefore to the field of detecting thermal, e.g. infrared radiation and to the field of infrared and ultrasonic imaging. These methods use generally monocrystalline, dielectric materials having a spontaneous polarization, which is very temperature dependent. This property is more particularly encountered in ferroelectric dielectric materials.

In general, pyroelectric radiation detectors comprise a plate capacitor, as shown in FIG. 1, whose dielectric material 2 is generally a monodomain ferro-electric monocrystal, i.e. it is pyroelectric. The faces of the monocrystal in contact with electrodes 4 and 6 of the capacitor are perpendicular to the polar axis P of the monocrystal, i.e. the polar axis P is directed in accordance with the normal N to the electrodes.

The absorption of the incident radiation, particularly infrared radiation, on the surface or within the actual dielectric material, leads to a temperature rise dT of the material and causes a variation $dP_s$ in its spontaneous polarization $P_s$. This leads to a voltage dV, which is applied to the input of a high impedance amplifier 8, e.g. constituted by a field effect transistor (FET).

More particularly in the case of infrared imaging, the upper electrode 5 of the capacitor is replaced, in the manner shown in FIG. 2, by a grid 10. The reading of the signal from the dielectric material 2 exposed to radiation is carried out by scanning point-by-point using an electron beam 12, the face of the device opposite that exposed by the radiation. This device, called a pyroelectric vidicon, makes it possible to restore on the actual device a video image of the illumination of the radiation, such as for example the image of an object from which the said radiation comes. As hereinbefore, the voltage dV which can differ at any point of the material resulting from the temperature rise of the latter, is applied to the input of a video amplifier 14.

In both these applications, the comparison and choice between the different pyroelectric materials takes place on the basis of qualitative and quantitative data.

From the quantitative standpoint, the most important parameters are as follows:

the pyroelectric coefficient p corresponding to the variation of the spontaneous polarization $P_s$ as a function of the temperature T, i.e. $p = \delta P_s / \delta T$;

the principal dielectric permittivity $\epsilon$ along the polar axis;

the loss angle and its variation as a function of the frequency in the range between 1 and 100 Hz, measured along the polar axis;

the calorific capacity C;

the lateral thermal conductivity K, i.e. determined in the plane perpendicular to the polar axis.

There is no need to consider these various parameters in isolation, when comparing the different materials. In general, an overall figure of merit M defined by the ratio $M = p/\epsilon C$ is used.

From the qualitative standpoint, the most significant properties are:

the homogeneity of the aforementioned parameters and particularly the homogeneity of the pyroelectric response, which is defined by the ratio $p/\epsilon$ (particularly important in the case of the pyroelectric vidicon);

the ease of handling and conditioning, more particularly the ease of cutting and polishing very thin plates having a large surface;

the ease of obtaining large samples without any defects, with regards to the preparation of the material.

There are two main categories of ferroelectric materials which are conventionally used in pyroelectric detection. The first category consists of crystals which are insoluble in water, such as crystals of $LiTaO_3$, $Pb_xZr_{1-x}TiO_3$, etc..., said materials also having high Curie temperatures. The second category consists of crystals having a Curie temperature close to ambient temperature and which are mainly soluble in water, such as triglycine sulphate (TGS), triglycine selenate (TGSe), triglycine fluoborate (TGFB), etc.

The first-mentioned materials have the advantage of being insensitive to moisture, but generally have a low pyroelectric response (low $p/\epsilon$). The second-mentioned materials are sensitive to moisture and consequently more difficult to use. Thus, it is necessary to encapsulate them in a dry atmosphere or in vacuum.

When used in connection with imaging, the sensitivity to moisture is not a serious disadvantage, because the material must be placed in a vacuum compatible with reading by an electron beam. In this type of application the universally used material is TGS. Its figure of merit M, close to ambient temperature, is one of the highest known. Unfortunately, this compound has serious disadvantages.

Thus, it is very difficult to grow large, homogeneous, defect-free monocrystals. Only through making a very considerable effort in the crystallogenesis of the material is it possible to prepare samples usable in infrared imaging. Moreover, the cutting and polishing of very thin plates (approx. 30 $\mu$m) is difficult to perform, due to the mediocre mechanical properties of this material.

With regards to the isomorphous materials of TGS, such as TGSe and TGFB, said materials have higher Curie temperatures than TGS and their figures of merit are also higher than those of TGS. Unfortunately, these materials are even more difficult to produce than TGS and their mechanical properties are not superior to those of the latter.

BRIEF SUMMARY OF THE INVENTION

The present invention relates to a pyroelectric vidicon and detector formed from a dielectric material, which makes it possible to obviate the aforementioned disadvantages.

More specifically, the present invention relates to a pyroelectric radiation detector comprising a dielectric material inserted between two parallel electrodes, said material being a monodomain ferroelectric monocrystal having a polar axis P and formed by ammonium phosphotellurate of chemical formula:

and throughout the remainder of the description, this material will be designated by the abbreviation APT.

This material can easily be obtained in the form of large monocrystals (several cm$^3$), which are homogeneous and defect-free. Thus, the crystallogenesis of this material is easier than that of TGS.

Moreover, plate cutting and polishing tests have revealed that this material has a much better behaviour than that of TGS. In particular, all APT plates are much less fragile than TGS plates.

Therefore, detectors made from the novel compound APT represent a considerable advance with regards to production costs, because the better mechanical properties of this novel material lead to improved production efficiency.

The invention also relates to a pyroelectric vidicon comprising a dielectric material inserted between a grid and an electrode, which are parallel to one another. After absorbing radiation, this material is able to emit a signal, which is detected point-by-point by means of an electron beam. It is a monodomain ferroelectric monocrystal having a polar axis P. The material is ammonium phosphotellurate of chemical formula:

According to a preferred embodiment of the invention, the polar axis P of the monocrystal is perpendicular to the faces thereof placed either in contact with the electrodes, in the case of the detector, or in contact with the grid and the electrode, in the case of the vidicon.

According to another preferred embodiment of the invention, the polar axis P of the monocrystal slopes by an angle $\delta$ relative to the normal to the faces of the monocrystal placed either in contact with the electrodes, in the case of the detector, or in contact with the grid and the electrode, in the case of the vidicon. Preferably, angle $\alpha$ is between 10° and 80°.

BRIEF DESCRIPTION OF THE DRAWINGS

The invention is described in greater detail hereinafter relative to non-limitative embodiments and the attached drawings, wherein show:

FIG. 1 already described, diagrammatically a pyroelectric detector.

FIG. 2, already described, diagrammatically a pyroelectric vidicon.

FIG. 3 the trajectory in plane $\vec{a}, \vec{c}$ of the end of the spontaneous polarization vector of APT, in a temperature range between 20° and 49° C.

FIG. 4 variations in the ratio p/ε of APT (Curve a) and TGS (Curve b), expressed in kV.cm$^{-1}$.°C.$^{-1}$, as a function of the temperature t expressed in °C.

DETAILED DESCRIPTION OF THE PREFERRED EMBODIMENTS

According to the invention, the dielectric material constituting the dielectric radiation detector (FIG. 1) and the pyroelectric vidicon (FIG. 2) is ammonium phosphotellurate (APT) of formula:

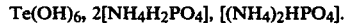

This material crystallizes in the monoclinic system and its class of symmetry is m. This material, which has a polar axis P in the mirror plane m (plane $\vec{a},\vec{c}$) and is consequently pyroelectric. Its spontaneous polarization P$_S$ varies both in modulus and direction. It should be noted that the direction variation, as a function of the temperature, of the spontaneous polarization of APT is a characteristic not encountered in TGS and the isomorphous compounds of TGS, which crystallize in the monoclinic system and are of class of symmetry 2.

Moreover, PTS, like TGS, is a ferroelectric material at ambient temperature. Its Curie temperature is quite comparable with that of TGS, which is 49° C.

FIG. 3 shows the trajectory in plane $\vec{a}, \vec{c}$, i.e. in the mirror plane m, of the end of the spontaneous polarization vector of APT, in a temperature range between 20° and 49° C. It can be seen that the trajectory T is relatively close to a straight line d passing through the origin defined by the intersection of vectors $\vec{a}$ and $\vec{c}$. This shows that the direction of the polar axis P varies little with temperature. Therefore, it is possible to define a section directed along the normal to the mean polar axis of the material, said normal direction corresponding to the natural faces 101 of the APT crystal. In other words, the mean polar axis P is directed along the normal N to electrodes 4 and 6 (FIG. 1) or to grid 10 and electrode 6 (FIG. 2).

FIG. 4 shows the variations of the ratio p/ε of APT (curve a) and TGS (curve b) expressed in kV.cm$^{-1}$.°C.$^{-1}$, as a function of the temperature t, expressed in °C. It should be noted that this ratio is slightly smaller in the case of APT. However, as stated hereinbefore, it is much easier to obtain large APT samples than TGS samples. It should be noted that APT monocrystals, like TGS monocrystals, are obtained from an aqueous solution.

In order to increase the ratio p/ε and consequently the figure of merit M of APT, research has shown that the increase of this ratio can be obtained by effecting a section of the APT monocrystal in a direction such that the polar axis P thereof is inclined by an angle $\alpha$ relative to the normal N to electrodes 4 and 6 (FIG. 1) or to the normal N to grid 10 and electrode 6 (FIG. 2). The direction of the polar axis P is represented by the straight line I in FIGS. 1 and 2.

According to the invention, this inclination angles $\alpha$ in the case of APT can be between 10° and 80°. The value of this angle is mainly dependent on the value of the figure of merit which it is desired to obtain and consequently the special envisaged use of the pyroelectric vidicon and detector according to the invention.

What is claimed is:

1. A pyroelectric radiation detector comprising a dielectric material inserted between two parallel electrodes, said material being a monodomain ferroelectric monocrystal having a polar axis, wherein the said material is ammonium phosphotellurate of chemical formula:

2. A pyroelectric detector according to claim 1, wherein the polar axis of the monocrystal is perpendicular to the faces of the latter in contact with the electrodes.

3. A pyroelectric detector according to claim 1, wherein the polar axis of the monocrystal is inclined by an angle $\alpha$ relative to the normal to the faces of the monocrystal placed in contact with the electrode.

4. A pyroelectric detector according to claim 3, wherein the angle $\alpha$ is 10° and 80° C.

5. A pyroelectric vidicon comprising a dielectric material inserted between a parallel grid and electrode, said material being able to emit, after radiation absorption, a signal detected point-by-point by means of an electron beam and being a monodomain ferroelectric monocrystal having a polar axis, wherein the material is ammonium phosphotellurate of chemical formula:

6. A pyroelectric vidicon according to claim 5, wherein the polar axis of the monocrystal is perpendicular to the faces of the latter in contact with the grid and the electrode.

7. A pyroelectric vidicon according to claim 5, wherein the polar axis of the monocrystal is inclined by an angle $\alpha$ relative to the normal to the faces of the monocrystal in contact with the grid and the electrode.

8. A pyroelectric vidicon according to claim 7, wherein the angle $\alpha$ is between 10° and 80°.

* * * * *